United States Patent [19]

Ebiya

[11] Patent Number: 5,717,352
[45] Date of Patent: Feb. 10, 1998

[54] WAVE FORMATTER CIRCUIT FOR SEMICONDUCTOR TEST SYSTEM

[75] Inventor: Koichi Ebiya, Kumagaya, Japan

[73] Assignee: Advantest Corporation, Tokyo, Japan

[21] Appl. No.: 577,736

[22] Filed: Dec. 22, 1995

[30] Foreign Application Priority Data

Dec. 22, 1994 [JP] Japan .................... 6-336075

[51] Int. Cl.$^6$ ........................................ H03K 5/01
[52] U.S. Cl. ....................... 327/166; 327/170; 326/51
[58] Field of Search ............................. 327/144, 164, 327/165, 166, 170, 172, 176, 178, 198, 291, 293, 294; 326/51

[56] References Cited

U.S. PATENT DOCUMENTS

| | | | |
|---|---|---|---|
| 3,270,288 | 8/1966 | Hackett | 327/166 |
| 4,475,210 | 10/1984 | Couch | 375/10 |
| 4,721,902 | 1/1988 | Tellerman et al. | 324/58.5 B |
| 4,760,291 | 7/1988 | Nakajima et al. | 326/86 |
| 4,972,161 | 11/1990 | Davies et al. | 327/166 |
| 5,034,624 | 7/1991 | Flaherty et al. | 327/166 |
| 5,179,293 | 1/1993 | Hilton | 327/480 |
| 5,305,271 | 4/1994 | Watanabe | 327/198 |
| 5,406,132 | 4/1995 | Housako | 327/172 |

*Primary Examiner*—Timothy P. Callahan
*Assistant Examiner*—My-Trang Nu Ton
*Attorney, Agent, or Firm*—Knobbe, Martens Olson & Bear, LLP

[57] ABSTRACT

A wave formatter circuit for generating a test signal of predetermined waveform in a repetition rate determined by a pattern cycle of a semiconductor test system includes a timing generator for generating a first clock signal and a second clock signal, a waveform shaper which receives the first and second clock signals for generating a set signal and a reset signal, a flip-flop which generates a test signal of predetermined waveform at the timing determined by the set signal and the reset signal, a pattern generator for generating a test pattern data at the rate of the pattern cycle, a data selector which selects first pattern data and second pattern data from the pattern generator to be supplied to the waveform shaper, an inhibit circuit which receives the first and second pattern data from the data selector and provides an inhibit signal to the waveform shaper to prohibit either one of the first and second clock signals in the same pattern cycle passing through the waveform shaper, where the set signal and the reset signal are generated by the timings determined by the first and second clock signals under the control of the first and second pattern data and the inhibit signal.

7 Claims, 7 Drawing Sheets

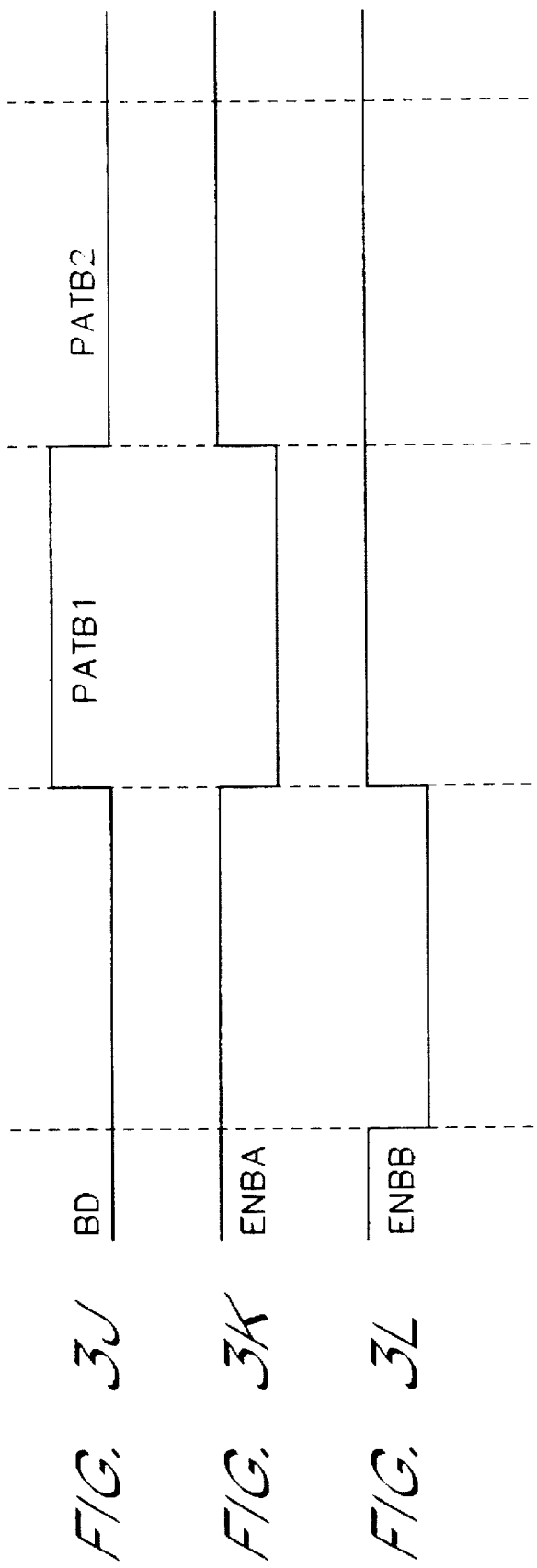

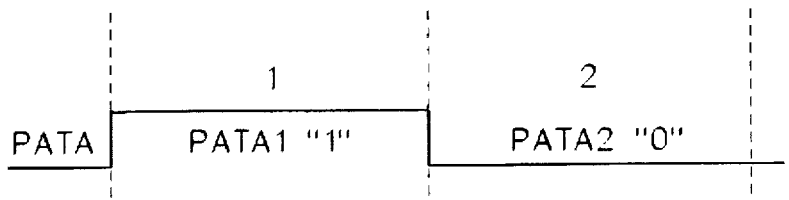
FIG. 5A (PRIOR ART)
FIG. 5B (PRIOR ART)
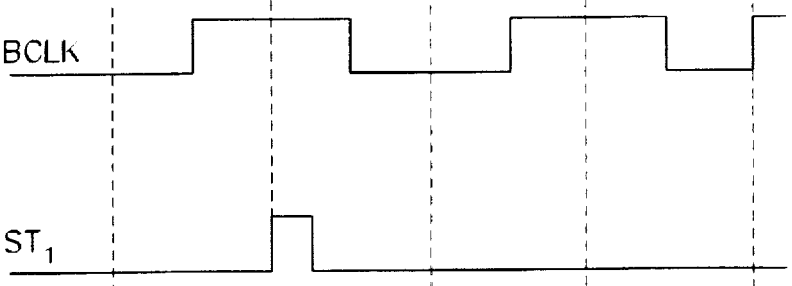
FIG. 5C (PRIOR ART)
FIG. 5D (PRIOR ART)
FIG. 5E (PRIOR ART)
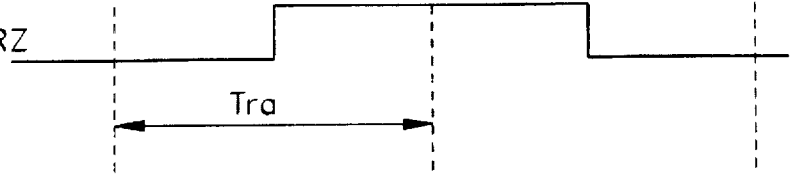
FIG. 5F (PRIOR ART)

WAVE FORMATTER CIRCUIT FOR SEMICONDUCTOR TEST SYSTEM

BACKGROUND OF THE INVENTION

This invention relates to a wave formatter circuit for a semiconductor test system to format test pattern signals to be supplied to a semiconductor device under test, and more particularly, to a wave formatter circuit for generating a test signal having a non-return to zero (NRZ) waveform with a faster repetition rate than a maximum repetition rate of a pattern cycle of the test system.

In testing a semiconductor device, a test system provides test pattern signals to corresponding pins of the semiconductor device under test (DUT). The resulted output signals from the DUT are compared with expected pattern signals produced by the test system to determine whether the DUT works correctly or not. Prior to supplying to the DUT, the waveform of the test pattern signals are formatted to a return to zero (RZ) waveform, a non-return to zero (NRZ) waveform or an exclusive OR (EOR) waveform as is well known in the art. This invention relates to a wave formatter circuit for generating the NRZ waveform.

FIG. 4 shows an example of circuit structure of a conventional wave formatter circuit and FIG. 5 is a timing chart showing the operation of the conventional wave formatter circuit of FIG. 4. A waveform shaper 13 is provided with timing signals from a timing generator 10 and pattern data selected by a programmable data selector 12. The programmable data selector 12 is provided with pattern data from a pattern generator 11. The waveform shaper 13 supplies a set signal ST and a reset signal RST to a set-reset flip-flop 15 through a pair of trailing edge differential circuits $14_1$ and $14_2$.

An output test signal of the flip-flop 15 is supplied to a pin of a semiconductor device under test through a driver (not shown) whereby an amplitude and a slew rate of the test signal are adjusted. In a semiconductor test system, a large number of sets of the programmable data selector 12, waveform shaper 13, SR flip-flop 15 and driver are arranged depending on the number of test channels. Each test channel in the test system corresponds to a device pin of the semiconductor device to be tested.

The waveform shaper 13 includes AND circuits $AND_1-AND_6$, OR circuits $OR_1$ and $OR_2$, and a control circuit 8. The AND circuits $AND_5$ and $AND_6$ are respectively provided with clock signals ACLK and BCLK from the timing generator 10. The AND circuits $AND_5$ and $AND_6$ are also provided with enable signals from the control circuit 8 which selectively enable one or both of the AND circuits. The output of the AND circuit $AND_5$ is connected to the AND circuits $AND_1$ and $AND_2$ while the output of the AND circuit $AND_6$ is connected to the AND circuits $AND_3$ and $AND_4$.

The programmable data selector 12 selects the pattern data from the pattern generator 11 to provide the selected pattern data to the waveform shaper 13 for each test channel. The AND circuits $AND_2$ and $AND_4$ respectively receive the inverted pattern data at their inputs. The OR circuit $OR_1$ is connected to the outputs of the AND circuits $AND_1$ and $AND_3$ to form the set signal ST to be supplied to the set-reset (SR) flip-flop 15 through the trailing edge differential circuit $14_1$. The OR circuit $OR_2$ is connected to the outputs of the AND circuits $AND_2$ and $AND_4$ to form the reset signal RST to be supplied to the SR flip-flop 15 through the trailing edge differential circuit $14_2$.

In generating a NRZ waveform by the wave formatter circuit of FIG. 4, the control circuit 8 enables the AND circuit $AND_5$ and disables the AND circuit $AND_6$ so that only the clock signal ACLK is used in the waveform shaper 13. This is because a NRZ waveform signal includes only one status change in a pattern cycle, and such a status change is controlled by a single clock signal. The pattern cycle (device test cycle) is a maximum operating cycle of the semiconductor test system determined by a reference clock therein.

In contrast, although not shown in this invention, an RZ waveform signal includes two status changes in the test pattern cycle, both the clock signals ACLK and BCLK are to be used in the waveform shaper 13. Thus, in the example of FIGS. 4 and 5, the clock BCLK is not used in generating the NRZ waveform. Further in this situation, the programmable data selector 12 provides the pattern data PATA to the AND circuits $AND_1 -AND_4$ in the waveform shaper 13.

In the example of FIG. 5, the pattern data PATA is set to "1" in the first test pattern cycle and "0" in the second test pattern cycle as shown in FIG. 5A. In the first pattern cycle, clock signal ACLK and the pattern data PATA pass through the AND circuit $AND_1$ and the OR circuit $OR_1$ to form a set signal ST at the output of the waveform shaper 13. Although not shown, the set signal ST has a trailing edge which corresponds to the trailing (falling) edge of the clock signal ACLK of FIG. 5B. As is well known in the art, the clock signal is controlled in its phase within the pattern cycle to determine the edges of the test signal, i.e., such as the NRZ waveform. Thus, in the first cycle, the trailing edge differential circuit $14_1$ detects the trailing edge of the set signal ST to generate a set signal $ST_1$ to be supplied to the SR flip-flop 15 as shown in FIG. 5D.

In the second pattern cycle, the low level of the pattern data PATA and the clock signal ACLK pass through the AND circuit $AND_2$ and the OR circuit $OR_2$ to form a reset signal RST at the output of the waveform shaper 13. Although not shown, the trailing edge of the reset signal RST is determined by the trailing edge of the clock signal ACLK in the pattern second cycle. Thus, in the second pattern cycle, the trailing edge differential circuit $14_2$ detects the trailing edge of the reset signal RST to generate a reset signal $RST_1$ to be supplied to the SR flip-flop 15 as shown in FIG. 5E. As a result, the flip-flop 15 generates a test signal having a NRZ waveform to be supplied to the device under test as shown in FIG. 5F.

FIG. 6 shows an example of circuit configuration of the trailing edge differential circuits $14_1$ and $14_2$ shown in FIG. 4. The trailing edge differential circuit 14 includes an inverter 33, an AND circuit 34 and a delay element 35. The delay element 35 provides a delay time $T_{pd}$ to an incoming signal, i.e., the set signal ST or the reset signal RST to be supplied to the AND circuit 34. The other input of the AND circuit 34 is provided with an inverted form of the set or reset signal from the inverter 33.

FIG. 7 shows an operation of the trailing edge differential circuit 14 of FIG. 6. The set signal ST or reset signal RST of FIG. 7A is given at the respective inputs of the inverter 33 and the delay element 35. The output ALIN of the inverter 33 is inverted in the polarity opposite to the input signal as shown in FIG. 7B. The output BLIN of the delay element 35 shown in FIG. 7C is time delayed by $T_{pd}$ from the signal shown in FIG. 7A. The AND circuit 34 receives the signal ALIN from the inverter 33 and the signal BLIN from the delay element 35 to generate the set signal ST1 or the reset signal RST1 which rises at the timing of the falling edge of the ST or RST signal and has a pulse width equal to the delay time $T_{pd}$ give by the delay element 35 as shown in FIG. 7D.

In the foregoing example of the conventional wave formatter circuit, one NRZ waveform is generated in one pattern cycle. Since the pattern cycle is the minimum time period $T_{ra}$ (FIG. 5F) of the test pattern generation by the test pattern generator 11, and the maximum repetition rate of the clock signal ACLK is the same as the repetition rate of the test pattern, the repetition rate of the NRZ waveform signal is limited to the pattern cycle. However, to test higher speed semiconductor devices with relatively low cost, it is desired that the wave formatter circuit can generate the NRZ waveform test signals whose repetition rate is higher than the pattern cycle.

SUMMARY OF THE INVENTION

Therefore, it is an object of the present invention to provide a wave formatter circuit for use in a semiconductor test system which is capable of generating an NRZ waveform test signal the repetition rate of which is higher than the maximum pattern cycle of the test system.

It is another object of the present invention to provide a wave formatter circuit for use in a semiconductor test system which is capable of accurately generating any sequence of the NRZ waveform test signal which is two times faster than the pattern cycle.

To accomplish these objectives, a wave formatter circuit to be used in a semiconductor test system for generating a predetermined waveform of test signal to be supplied to a semiconductor device to be tested in a repetition rate determined by a pattern cycle of the test system includes a timing generator for generating a first clock signal and a second clock signal each of which has a pulse width smaller than the pattern cycle, a waveform shaper for generating a set signal and a reset signal wherein the waveform shaper receives the first and second clock signals to determine timings of the set signal and said reset signal, a flip-flop which generates a test signal of predetermined waveform at the timing determined by the set signal and the reset signal, a pattern generator for generating a test pattern data at the rate of the pattern cycle, a data selector which receives the pattern data from said pattern generator and selects first pattern data and second pattern data in the pattern data from the pattern generator and supplies the first and second pattern data to the waveform shaper, an inhibit circuit which receives the first and second pattern data from the data selector and provides an inhibit signal to the waveform shaper to prohibit either one of the first and second clock signals in the same pattern cycle passing through the waveform shaper as the set or reset signal, where the set signal and the reset signal are generated by the timings determined by the first and second clock signals under the control of the first and second pattern data and the inhibit signal.

According to the present invention, the wave formatter circuit of the present invention can accurately generate the NRZ waveform test signals which is faster than the pattern cycle (test rate) of the semiconductor test system.

The wave formatter circuit of the present invention can generate the NRZ waveform test signals to test higher speed semiconductor devices with relatively low cost.

BRIEF DESCRIPTION OF THE DRAWINGS

FIGS. 3A-3L are a timing chart showing an operation of the wave formatter circuit wherein a specific problem associated therein is overcome by the inhibit circuit of FIG. 1.

FIGS. 5A-5F are a timing chart showing an operation of the conventional wave formatter circuit of FIG. 4.

DETAILED DESCRIPTION OF THE PREFERRED EMBODIMENT

Figure 1:
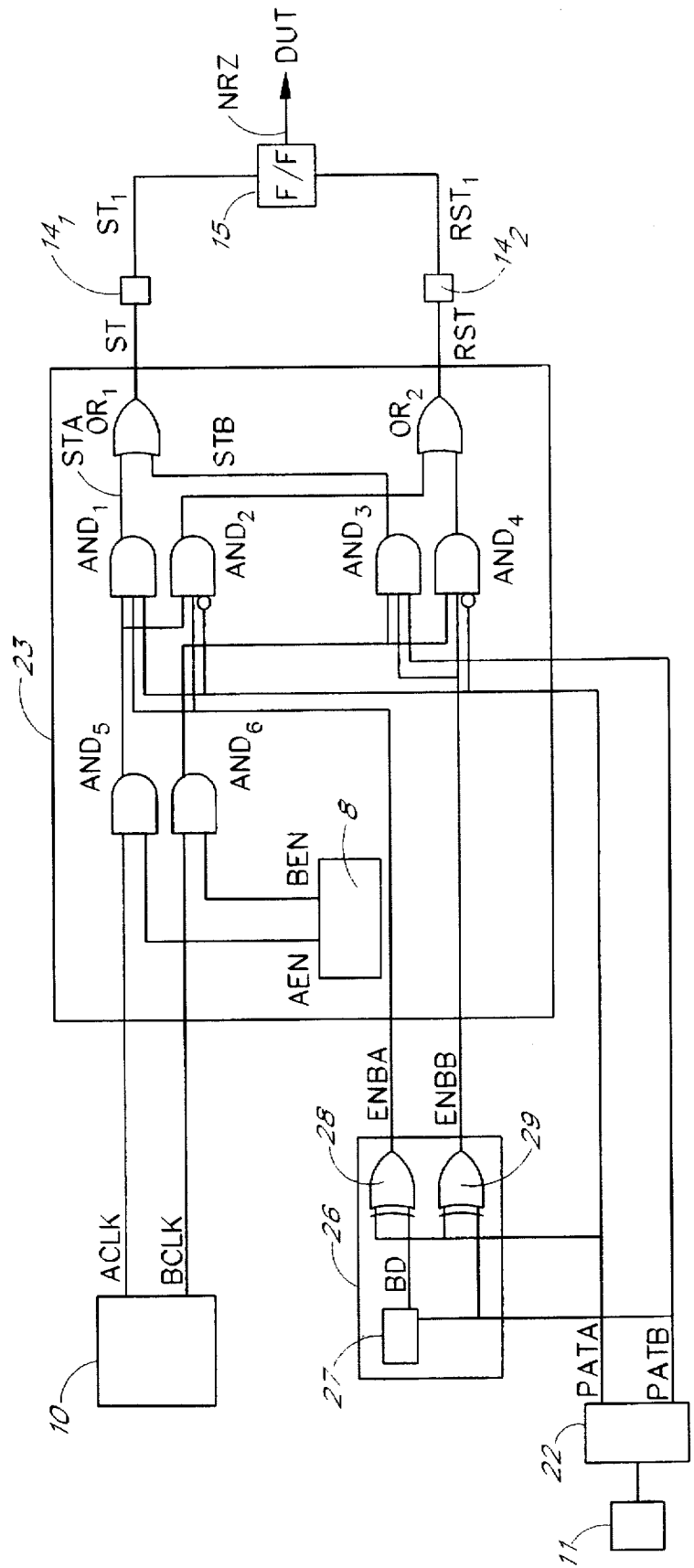
FIG. 1 is a block diagram showing a structure of the wave formatter circuit of the present invention.
Figure 4:
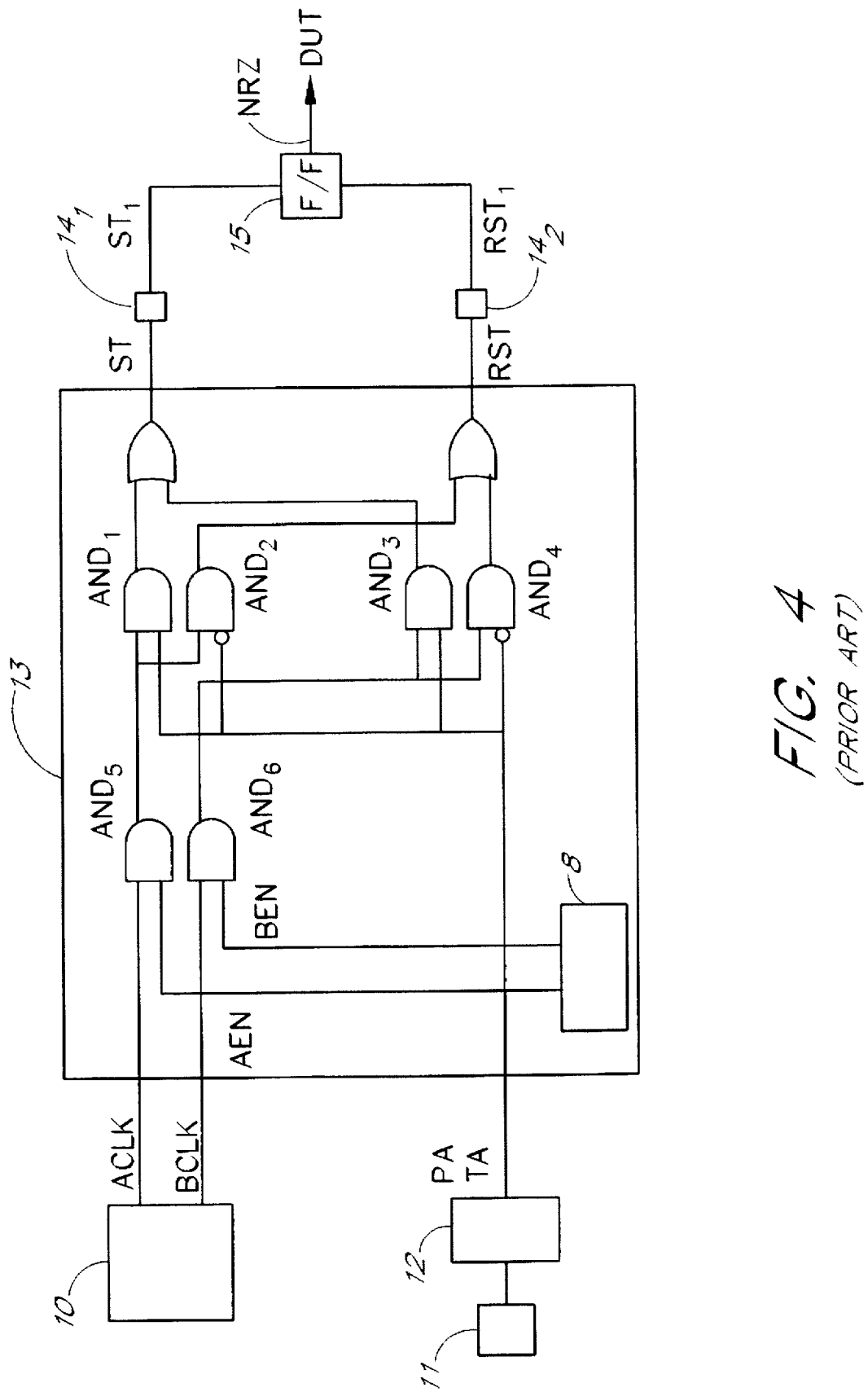
FIG. 4 is a block diagram showing a structure of the conventional wave formatter circuit.
Figure 6:
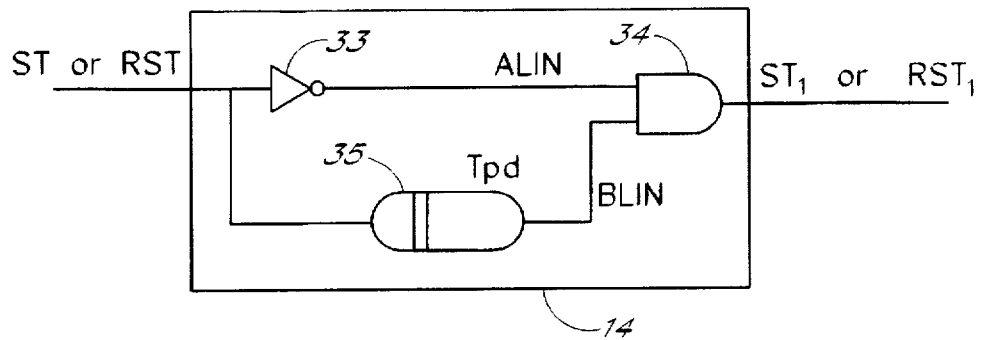
FIG. 6 is a circuit diagram of the trailing edge differential circuit of FIGS. 1 and 4.
Figure 7A:
FIGS. 7A-7D are a timing chart showing an operation of the trailing edge differential circuit of FIG. 6.
Figure 7B:
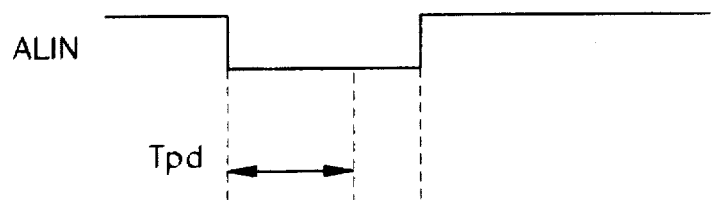
Figure 7C:
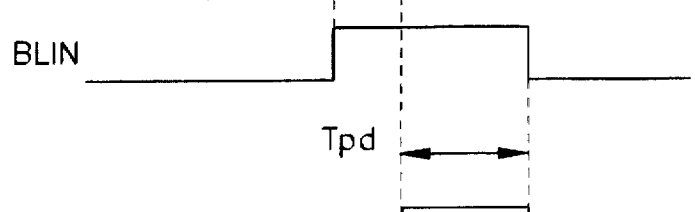
Figure 7D:

FIG. 1 is a block diagram of an embodiments of the wave formatter circuit configuration of the present invention. Similar to the conventional example of FIG. 4, a waveform shaper 23 is provided with clock signals ACLK and BCLK from a timing generator 10. Timing edges of the clock signals ACLK and BCLK are varied within a pattern cycle to determine the timing of a test signal to be supplied to the semiconductor device under test (not shown).

The waveform shaper 23 is also provided with the pattern data PATA and PATB selected by a programmable data selector 22. The pattern data PATA and PATB respectively correspond to the clock signals ACLK and BCLK from the timing generator 10. The programmable data selector 22 is provided with pattern data from a pattern generator 11 at the rate of the pattern cycle. An inhibit circuit 26 is arranged to control the application of the clock signals ACLK and BCLK to the waveform shaper 23 by inhibit signals ENBA and ENBB.

The waveform shaper 23 supplies a set signal ST and a reset signal RST to a set-reset flip-flop 15 through a pair of trailing edge differential circuits $14_1$ and $14_2$. An output test signal of the flip-flop 15 is supplied to a corresponding device pin of a semiconductor device under test through a driver (not shown) whereby an amplitude and a slew rate of the test signal are adjusted. In a semiconductor test system, a large number of sets of the waveform shaper 23, the programmable data selector 22, the SR flip-flop 15 and the driver are arranged depending on the number of test channels, for example 500 channels, of the test system. Each test channel corresponds to a device pin of the semiconductor device to be tested.

The waveform shaper 23 includes AND circuits $AND_1$–$AND_6$, OR circuits $OR_1$ and $OR_2$, and a control circuit 8. The AND circuits $AND_5$ and $AND_6$ are respectively provided with clock signals ACLK and BCLK from the timing generator 10. The AND circuits $AND_5$ and $AND_6$ are also provided with enable signals from the control circuit 8 which selectively enable one of both of the AND circuits. The output of the AND circuit $AND_5$ is connected to the AND circuits $AND_1$ and $AND_2$ while the output of the AND circuit $AND_6$ is connected to the AND circuits $AND_3$ and $AND_4$.

The inhibit circuit 26 includes a delay circuit 27 which has a delay time equal to the time interval of one pattern cycle and a pair of exclusive OR circuits 28 and 29. The delay circuit 27 receives the pattern data PATB from the programmable data selector 22. The exclusive OR circuits 28 and 29 receive the pattern data PATA from the data selector 22 at one input terminal. The other input of the exclusive OR circuit 28 receives the pattern data PATB which is delayed by one cycle by the delay circuit 27 while the other input of the exclusive OR 29 receives the pattern data PATB directly from the data selector 22. As shown in FIG. 1, the inhibit signal ENBA from the exclusive OR circuit 28 is provided to the AND circuits $AND_1$ and $AND_2$ and the inhibit signal ENBB from the exclusive OR circuit 29 is provided to the AND circuits $AND_3$ and $AND_4$.

In the arrangement of FIG. 1, the programmable data selector 22 selects the pattern data PATA and PATB from the pattern generator 11 to provide the pattern data PATA to the AND circuits $AND_1$ and $AND_2$ and the pattern data PATB to the AND circuits $AND_3$ and $AND_4$ of the waveform shaper 23. The AND circuits $AND_2$ and $AND_4$ respectively receive the inverted pattern data because of the inverted input terminals. The OR circuit $OR_1$ is connected to the outputs of the AND circuits $AND_1$ and $AND_3$ to form the set signal ST to be supplied to the SR flip-flop 15 through the trailing edge differential circuit $14_1$. The OR circuit $OR_2$ is connected to the outputs of the AND circuits $AND_2$ and $AND_4$ to form the reset signal RST to be supplied to the SR flip-flop 15 through the trailing edge differential circuit $14_2$.

In generating a NRZ waveform by the wave formatter circuit of FIG. 1, the control circuit 8 enables both the AND circuits $AND_5$ and $AND_6$ so that a falling edge of the clock signal ACLK is used to trigger a set signal ST or a reset signal RST and a falling edge of the clock signal BCLK is used to trigger a set signal ST or a reset signal RST. The phases of the clocks signals ACLK and BCLK are variable within the pattern cycle by the known arrangement (not shown) in the art. In this example, the pattern data PATA designates a first signal state of the NRZ waveform and the pattern data PATB designates a second signal state of the NRZ waveform in each of the pattern cycle.

FIG. 2 is a timing chart showing the operation of the wave formatter circuit of FIG. 1. In this example, it is assumed that the inhibit signals ENBA and ENBB are in a high level, i.e., the inhibit circuit 26 is not working to inhibit the operation of the $AND_1$–$AND_4$ for the convenience of explaining the purpose of the inhibit circuit 26 later. As shown in FIGS. 2A and 2B, the pattern data PATA and PATB selected by the data selector 23 designate that the sequence of signal states of the NRZ waveform to be generated is "1"-"0" (pattern cycle 1) and "1"-"0" (pattern cycle 2), i.e., "1"-"0"-"1"-"0" in the two pattern cycles. The timing generator 10 provides the clock signal ACLK having the falling edge at around the middle of the pattern cycle (FIG. 2B) and the clock signal BCLK having the falling edge at around the same timing of the end of the pattern cycle (FIG. 2D).

In the wave formatter circuit 23, the pattern data PATA is used to determine whether the clock signal ACLK is used to trigger the set signal ST or the reset signal RST. The pattern data PATB is used to determine whether the clock signal BCLK is used to trigger the set signal ST or the reset signal RST. In the example of FIG. 2, since the pattern data PATA is "1" both in the first and second pattern cycle, the clock signal ACLK is used to generate set signals ST through the AND circuit $AND_1$ in the first and second pattern cycles. Further, since the pattern data PATB is "0" both in the first and second pattern cycle, the clock signal BCLK is used to generate the reset signals RST through the $AND_4$ in the first and second pattern cycles.

Figure 2A:
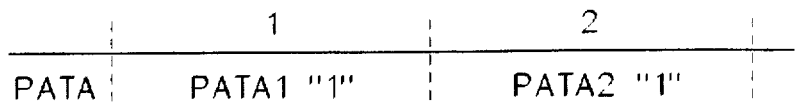
FIGS. 2A-2G are a timing chart showing an operation of the wave formatter circuit of FIG. 1.
Figure 2B:
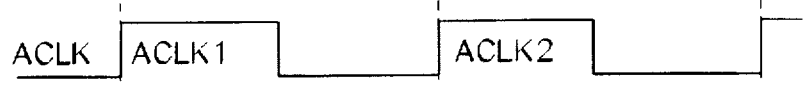
Figure 2C:
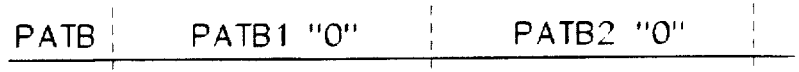
Figure 2D:
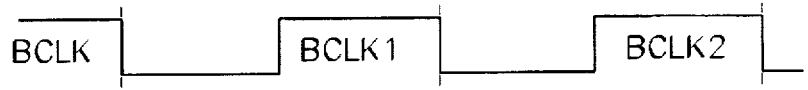
Figure 2E:
Figure 2F:
Figure 2G:
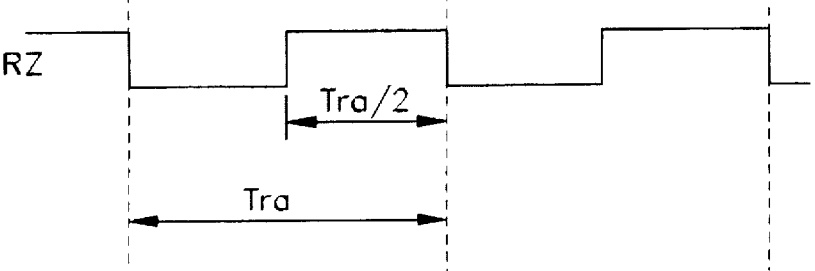

Thus, through the trailing edge differential circuits $14_1$ and $14_2$, a set signal ST1 of FIG. 2E and a reset signal RST1 of FIG. 2F are provided to the SR flip-flop 15. The flip-flop 15 generates the NRZ waveform test signal as shown in FIG. 2G which has a signal repetition rate two times higher than the pattern cycle. Namely, the device test rate for the NRZ waveform test signal increases by two times compared with the conventional example of FIGS. 4 and 5.

Figure 3A:
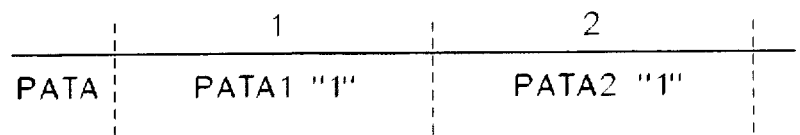
Figure 3B:
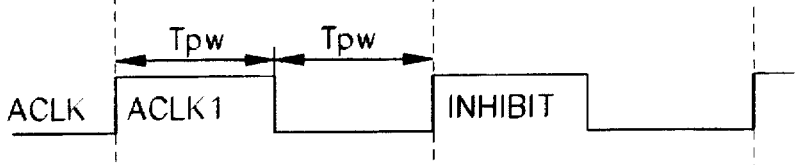
Figure 3C:
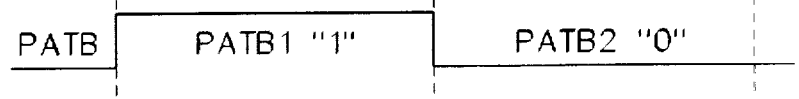
Figure 3D:
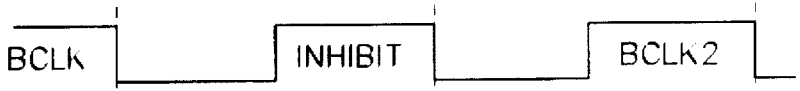

FIGS. 3A and 3C show a situation where the pattern data PATA and PATB selected by the data selector 23 designate that the sequence of signal states of the NRZ waveform to be generated is "1"-"1"-"1"-"0". The first "1"-"1" is designated by the data PATA and PATB in the first pattern cycle, and the last "1"-"0" is designated by the data PATA and PATB in the second pattern cycle. Namely, the pattern data PATB changes from the state "1" in the first pattern cycle to the state "0" in the second pattern cycle in contrast to the example of FIG. 2. The clock signals ACLK and BCLK are provided to the waveform shaper 23 in the same manner as in the example of FIG. 2.

In the wave formatter circuit 23, like the example noted above with reference to FIG. 2, the pattern data PATA is used to determine whether the falling edge of the clock signal ACLK is used to trigger the set signal ST or the reset signal RST. The pattern data PATB is used to determine whether the falling edge of the clock signal BCLK is used to trigger the set signal ST or the reset signal RST.

In the situation of FIG. 3, if the inhibit circuit 26 is not included in the waveform shaper 23, the following problem will arise. Since the pattern data PATA is "1" in the first and second pattern cycles, the set signal ST of FIG. 3E will be generated by the timing of the clock signal ACLK derived through the AND circuit $AND_1$ and the OR circuit $OR_1$. However, since the pattern data PATB is also "1" in the first pattern cycle, the clock signal BCLK the rising edge of which is in the same or earlier timing to the falling edge of the clock signal ACLK passes through the AND circuit $AND_3$ and the OR circuit $OR_1$.

Thus, the set signal ST remains the "1" state after the timing of the clock signal ACLK in the first pattern cycle because of the clock signal BCLK. As a result, the set signal ST at the output of the waveform shaper 23 shows a waveform as shown by the dotted line of the FIG. 3E although the waveform of the solid line is desired to be generated. Namely, the trailing edge of the clock signal ACLK in the first pattern cycle is not detected to be used as a set signal. The AND circuits $AND_2$ and $AND_4$ are closed during the first pattern cycle since the pattern data PATA and PATB are in the high level. In the second pattern cycle, the AND circuit $AND_2$ is still closed since the pattern data PATA is high level while the AND circuit $AND_4$ is open since the pattern data PATB is low level. Therefore, the reset signal RST is generated at the timing of the clock signal BCLK in the second pattern cycle as desired.

Figure 3E:
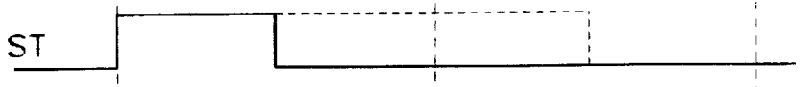
Figure 3F:
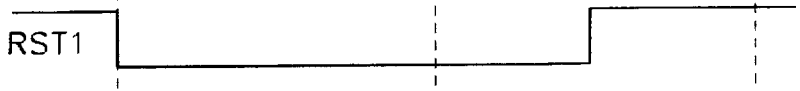
Figure 3G:
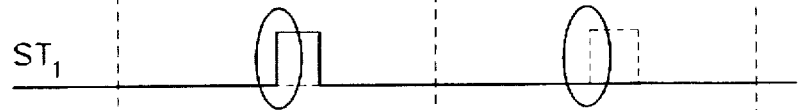
Figure 3H:
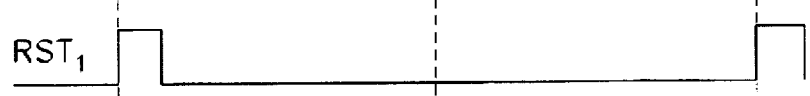
Figure 3I:
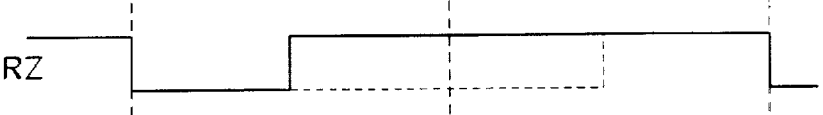

As a consequence, in this example, the trailing edge differential circuits $14_1$ and $14_2$ respectively generate the set signal ST1 shown by the dotted line of FIG. 3G and the reset signal RST1 shown in FIG. 3H. The resulted NRZ waveform test signal shown by the dotted line of FIG. 3I does not accurately represent the desired test signal designated by the pattern data PATA and PATB. In the pattern data PATA and PATB of FIGS. 3A and 3C, the set signal ST from the waveform shaper 23 and thus the set signal ST1 by the differential circuit 14 must be generated as shown in the solid lines of FIGS. 3E and 3G to generate the accurate NRZ waveform test signal shown by the solid line of FIG. 3I by the SR flip-flop.

Thus, in contrast to the data sequence defined in the example of FIG. 2 in which the data changes from "1" to "0" in the first pattern cycle, in the situation of FIG. 3 where the data remain the same as "1" and "1" in the first pattern cycle, the set signal ST will not be correctly generated by the waveform shaper 23. This is because the clock signals ACLK and BCLK are combined together in terms of timing in the first pattern cycle and as a result the trailing edge of the clock signal ACLK is not distinguished by the waveform shaper 23.

To avoid such a situation where the clock signals ACLK and BCLK are Combined together, i.e., to make the falling edge of the clock signal ACLK end earlier than the rising edge of the clock signal BCLK so as not to combine each other, the time period of the pattern cycle has to be greater than two times of the pulse width $T_{pw}$ of the clock signals ACLK or BCLK shown in FIGS. 3B. However, to increase the time period of the pattern cycle arises a problem that the test rate of the semiconductor test system decreases and the repetition rate of the NRZ waveform will not be effectively increased.

In this invention, the inhibit circuit 26 is newly incorporated to solve this problem. The inhibit circuit 26 includes the delay circuit 27 which provides the delay time equal to one pattern cycle to the pattern data PATB from the programmable data selector 22. The exclusive OR circuits 28 and 29 receive the pattern data PATA from the data selector 22 at one input terminal. The other input of the exclusive OR circuit 28 receives the pattern data BD (FIG. 3J) which is the pattern data PATB delayed by one cycle by the delay circuit 27 while the other input of the exclusive OR circuit 29 receives the pattern data PATB without delay directly from the data selector 22.

In this arrangement, when the pattern data PATA and the pattern data BD coincide, the exclusive OR circuit 28 makes the enable signal ENBA low level as shown in the second pattern cycle of FIG. 3K. This low level from the exclusive OR circuit 28 works as an inhibit signal which makes the AND circuits $AND_1$ and $AND_2$ inoperable for the clock signal ACLK passing therethrough. When the pattern data PATA and the pattern data PATB coincide as in the first cycle of FIG. 3, the exclusive OR circuit 29 makes the enable signal ENBB low level as shown in first pattern cycle of FIG. 3L. This low level from the exclusive OR circuit 29 inhibits the clock signal BCLK from passing through the AND circuits $AND_3$ and $AND_4$.

In the first pattern cycle, since the clock signal BCLK is inhibited to pass through the AND circuit $AND_3$, only the clock signal ACLK passes through the AND circuit $AND_1$, the OR circuit $OR_1$ and reaches the trailing edge differential circuit $14_1$. Thus, at the timing of the trailing edge of the clock signal ACLK, the set signal ST1 is produced by the trailing edge differential circuit $14_1$ as shown by the solid line of FIG. 3G. Similarly, in the second pattern cycle, since the clock signal ACLK is inhibited to pass through the AND circuit $AND^1$, the set signal ST shown by the dotted line of FIG. 3E is eliminated.

Namely, the set signal ST1 from the trailing edge differential circuit $14_1$ as shown by the dotted line of FIG. 3G is not produced in the second pattern cycle. As a consequence, the SR flip-flop 15 generates the NRZ waveform signal as shown by the solid line of FIG. 3I which indicate the accurate data sequence of "1"-"1"-"1"-"0" in the two pattern cycle.

As in the foregoing, by including the inhibit circuit 26, the set signal ST and the reset signal RST are alternately generated at the timing of the trailing edge of the clock signal. Thus, the NRZ waveform test signal can be accurately generated in the data sequence of FIG. 3 without increasing the time period of the pattern cycle. According to the present invention, the wave formatter circuit of the present invention can accurately generate the NRZ waveform test signals which is faster than the pattern cycle (test rate) of the semiconductor test system.

What is claimed is:

1. A wave formatter circuit to be used in a semiconductor test system for generating a predetermined waveform of test signal to be supplied to a semiconductor device to be tested in a repetition rate determined by a pattern cycle of the test system, comprising:

a timing generator for generating a first clock signal and a second clock signal each of which has a pulse width smaller than said pattern cycle;

a waveform shaper for generating a set signal and a reset signal, said waveform shaper receiving said first and second clock signals to determine timings of said set signal and said reset signal;

a flip-flop which generates a test signal of predetermined waveform at the timing determined by said set signal and said reset signal;

a pattern generator for generating a test pattern data at the rate of said pattern cycle;

a data selector which receives said pattern data from said pattern generator and selects first pattern data and second pattern data from said pattern generator and supplies said first and second pattern data to said waveform shaper;

an inhibit circuit which receives said first and second pattern data from said data selector and provides an inhibit signal to said waveform shaper to prohibit either one of said first and second clock signals in the same pattern cycle passing through said waveform shaper as said set signal or said reset signal; said inhibit circuit comprising:

a delay circuit which receives said second pattern data from said data selector and provides a delay time which is equal to said pattern cycle of said second pattern data;

a first exclusive OR circuit which receives said first pattern data and delayed pattern data which is said second pattern data delayed by one pattern cycle by said delay circuit; and a second exclusive OR circuit which receives said first and second pattern data from said data selector;

wherein said set signal and said reset signal are generated by the timings determined by said first and second clock signals, and under the control of said first and second pattern data from said data selector and said inhibit signal from said inhibit circuit.

2. The wave formatter circuit as defined in claim 1, further includes a pair of differential circuits connected between said waveform shaper and said flip-flop, each of said pair of differential circuits detecting a trailing edge of either of skid set signal or said reset signal and providing a flip-flop trigger signal which starts at the timing of said trailing edge to said flip-flop circuit.

3. The wave formatter circuit as defined in claim 2, wherein each of said pair of differential circuits includes an inverter which inverts incoming signal which is either of said set or reset signal from said waveform shaper, a delay element which provides a delay time to said incoming signal and an AND circuit which receives outputs of said inverter and of said delay element to generate said flip-flop trigger signal which starts at the timing of said trailing edge of said set or reset signal to be supplied to said flip-flop circuit.

4. The wave formatter circuit as defined in claim 1, wherein a phase of each of said first and second clock signals is variable within said pattern cycle, said phase of each of said first and second clock signals being controlled by said timing generator.

5. The wave formatter circuit as defined in claim 1, wherein said first exclusive OR circuit generates a first inhibit signal when both of said first pattern data and said delayed pattern data from said delay circuit coincide each other to inhibit said first clock signal from passing through said waveform shaper, and said second exclusive OR circuit generates a second inhibit signal when both of said first pattern data and said second pattern data coincide each other to inhibit said second clock signal from passing through said waveform shaper.

6. The wave formatter circuit as defined in claim 1, wherein said waveform shaper comprising:

- a first and second AND circuits each of which is provided with said first clock signal from said timing generator, said first pattern data from said data selector and an output of said first exclusive OR circuit of said inhibit circuit;
- a third and fourth AND circuits each of which is provided with said second clock signal from said timing generator, said second pattern data from said data selector and an output of said second exclusive OR circuit of said inhibit circuit;
- a first OR circuit which is provided with outputs of said first and third AND circuits to generate said set signal to be supplied to said flip-flop; and
- a second OR circuit which is provided with outputs of said second and fourth AND circuits to generate said reset signal to be supplied to said flip-flop.

7. The wave formatter circuit as defined in claim 6, wherein said second AND circuit receives said first pattern data with an inverted form and said fourth AND circuit receives said second pattern data with an inverted form.

* * * * *